United States Patent
Nguyen et al.

(10) Patent No.: US 7,830,039 B2
(45) Date of Patent: Nov. 9, 2010

(54) SYSTEMS AND CIRCUITS WITH MULTIRANGE AND LOCALIZED DETECTION OF VALID POWER

(75) Inventors: Daniel P. Nguyen, Campbell, CA (US); Steve X. Chi, Cupertino, CA (US)

(73) Assignee: SanDisk Corporation, Milpitas, CA (US)

( * ) Notice: Subject to any disclaimer, the term of this patent is extended or adjusted under 35 U.S.C. 154(b) by 206 days.

(21) Appl. No.: 11/965,943

(22) Filed: Dec. 28, 2007

(65) Prior Publication Data

US 2009/0167093 A1    Jul. 2, 2009

(51) Int. Cl.
*H02J 7/00* (2006.01)

(52) U.S. Cl. .................................................. 307/65

(58) Field of Classification Search .................. 307/65
See application file for complete search history.

(56) References Cited

U.S. PATENT DOCUMENTS

| | | |
|---|---|---|
| 5,969,438 A | 10/1999 | Odaohara |
| 6,750,683 B2 | 6/2004 | McClure et al. |
| 2003/0135830 A1 | 7/2003 | Buffet et al. |
| 2004/0268278 A1 | 12/2004 | Hoberman et al. |
| 2006/0203556 A1 | 9/2006 | Chen et al. |
| 2008/0246509 A1* | 10/2008 | Xiao et al. .............. 326/39 |

OTHER PUBLICATIONS

International Search Report mailed Jul. 27, 2009, for International Application No. PCT/US2008/086553.
Written Opinion of the International Searching Authority mailed on Jul. 27, 2009, for International Application No. PCT/US2008/086553.

* cited by examiner

*Primary Examiner*—Robert L. DeBeradinis
(74) *Attorney, Agent, or Firm*—Brinks Hofer Gilson & Lione

(57) ABSTRACT

Methods and systems for automatically and/or locally adjusting power-valid detection. In one class of embodiments, local power-on-reset circuits are included in individual power islands; in another class of embodiments, the power-on-reset circuit is automatically reprogrammed, depending on the detected interface voltage level, to use the same circuitry for power-valid detection in either case.

38 Claims, 9 Drawing Sheets

US 7,830,039 B2

SYSTEMS AND CIRCUITS WITH MULTIRANGE AND LOCALIZED DETECTION OF VALID POWER

BACKGROUND

The present application relates to low-power integrated circuits (and to methods and systems which include low-power integrated circuits), and more particularly to low-power integrated circuits which must be able to interface to multiple external supply voltages (and to methods and systems which include such integrated circuits).

One of the basic requirements of digital integrated circuits is some way to avoid operating at improper power voltages. When the supply voltage is too low, it is possible for some digital circuits to enter an unpredictable state. With programmable, binary logic, such an unpredictable state may result in a device which is locked up and inoperable.

To avoid this, integrated circuits very commonly include a special circuit to detect whether the power supply is in its valid range. Such circuits are often referred to as "power-on reset" or POR circuits, since they typically assert a reset signal as soon as they are powered up. The POR circuit stops asserting the reset signal when it detects that the power supply is in its valid range. The logic in the integrated circuit can then begin to execute its operations reliably, since it is starting from a known initial state. The binary logic is predictable without logic fluctuations stemming from out of range voltage.

The POR function is often implemented by including a bandgap voltage reference on the chip. The bandgap voltage reference outputs a fixed reference voltage as soon as it receives sufficient voltage. This fixed reference voltage is compared with a divided-down fraction of the current power supply voltage to determine whether the supply voltage is in the chip's valid range. Typically, this fraction is determined by a pair of resistors. Since the value of the fixed reference is approximately 1.23V and uncontrollable, the value of the fraction determines the power voltage detected.

In interface circuits, it is similarly desirable not to begin data operations while the supply voltage is still powering up to a valid level in the operating range of the chip. This can result in an unpredictable loss of bits or blocks at the beginning of the transmission, or state errors at the receiver.

SUMMARY

The present application discloses new approaches to power screening in a multi-interface power island. Chips with a power island architecture can have portions of the chip turned on and off under variable conditions. In one class of embodiments, the power island is included in a data module which is able to communicate with different interfaces which operate at different voltages by using a voltage-detection circuit to determine whether the higher voltage from an external source is present which is outside the operating range. If the higher voltage is present, it is tested for validity within the appropriate higher range. In another class of embodiments, different power islands each include their own power-valid detection circuits for local power-valid testing. In many embodiments these ideas are combined synergistically, especially in a portable data module with multi-interface capability.

The disclosed innovations, in various embodiments, provide one or more of at least the following advantages:

System adaptability to multi-voltage interface requirements.

Greater simplicity of architecture, since individual design blocks can be customized for their appropriate requirements of power valid.

Design is simpler when individual power islands can be placed or duplicated without worrying about external management of power validity.

Powering up can be done without unnecessary delay.

In embodiments where a single reference voltage is routed around the chip, there is no additional static power consumption from a local (per dynamic power island) power monitor.

BRIEF DESCRIPTION OF THE DRAWINGS

The disclosed inventions will be described with reference to the accompanying drawings, which show important sample embodiments of the invention and which are incorporated in the specification hereof by reference, wherein.

DETAILED DESCRIPTION OF THE PREFERRED EMBODIMENTS

The numerous innovative teachings of the present application will be described with particular reference to presently preferred embodiments (by way of example, and not of limitation).

Figure 1:
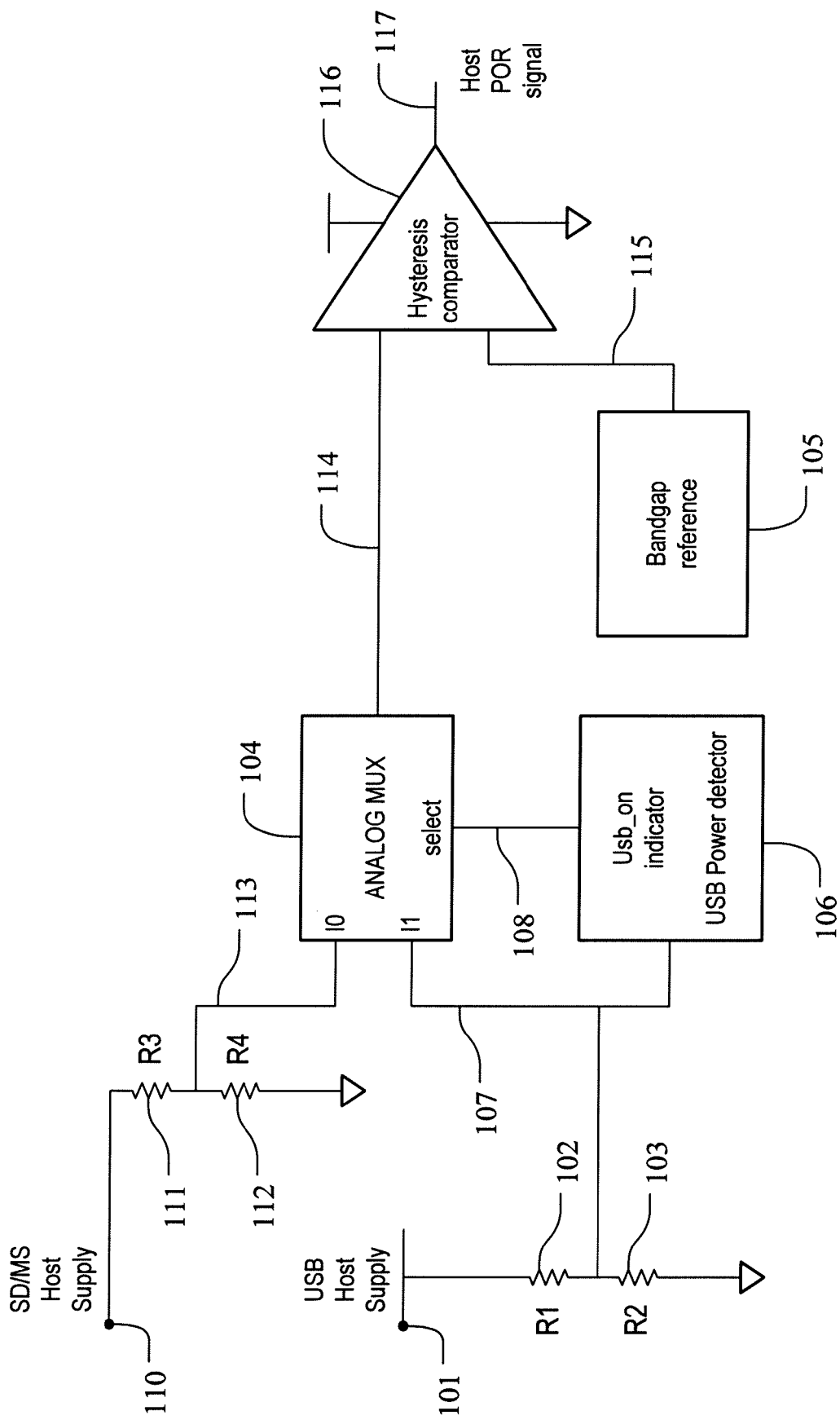
FIG. 1 schematically shows an automatically switched power-on reset circuit.

FIG. 1 schematically shows an automatically switched power-on reset (POR) circuit. The signal names used in this example show how this circuit would connect into the complete design of FIGS. 1A-1D, but these exemplary connections and labels are not all necessary for practicing the disclosed inventions.

The external connection to USB (Universal Serial Bus) Host Supply 101 is divided down, by the matched resistors $R_1$ 102 and $R_2$ 103, to produce a divided-down voltage at input 11 to the analog multiplexer 104 through a USB Host Supply line 107, which is comparable to the 1.23V reference voltage from bandgap reference voltage generator 105. The same divided-down voltage, in this exemplary embodiment, is also provided to a USB power detector block 106. If power is present on the USB Host Supply line 107, the USB power detector block 106 provides a USB On signal through signal line 108 to the analog multiplexer 104, which causes it to select the divided-down voltage from the $R_1/R_2$ node (102/103) on the USB Host Supply line 107. A SD/MS (Secure Digital/Memory Stick) Host Supply 110 is similarly divided down by the resistors $R_3$ 111 and $R_4$ 112 to produce a second divided-down voltage at input 10 to the analog multiplexer 104 by the SD/MS Host Supply line 113. If no USB On signal through signal line 108 to the analog multiplexer 104 is present, the analog multiplexer 104 will select the divided-down voltage from the $R_3/R_4$ (111/112) node at the SD/MS Host Supply line 113.

The hysteretic comparator 116 operates conventionally, comparing whichever divided-down supply voltage fraction it receives from the analog multiplexer 104 on signal line 114 against the voltage from the bandgap reference stage received on signal line 115. The hysteretic comparator 116 produces a Host POR logic signal 117 which indicates whether power from the host circuit is within specifications. This logic signal prevents components which depend on host power from operating if the host power is not valid. A very wide variety of circuits are known for the implementation of this comparator, and any of them can be used in the circuit of FIG. 1.

Exemplary Integrated Circuit

Figure 1A:
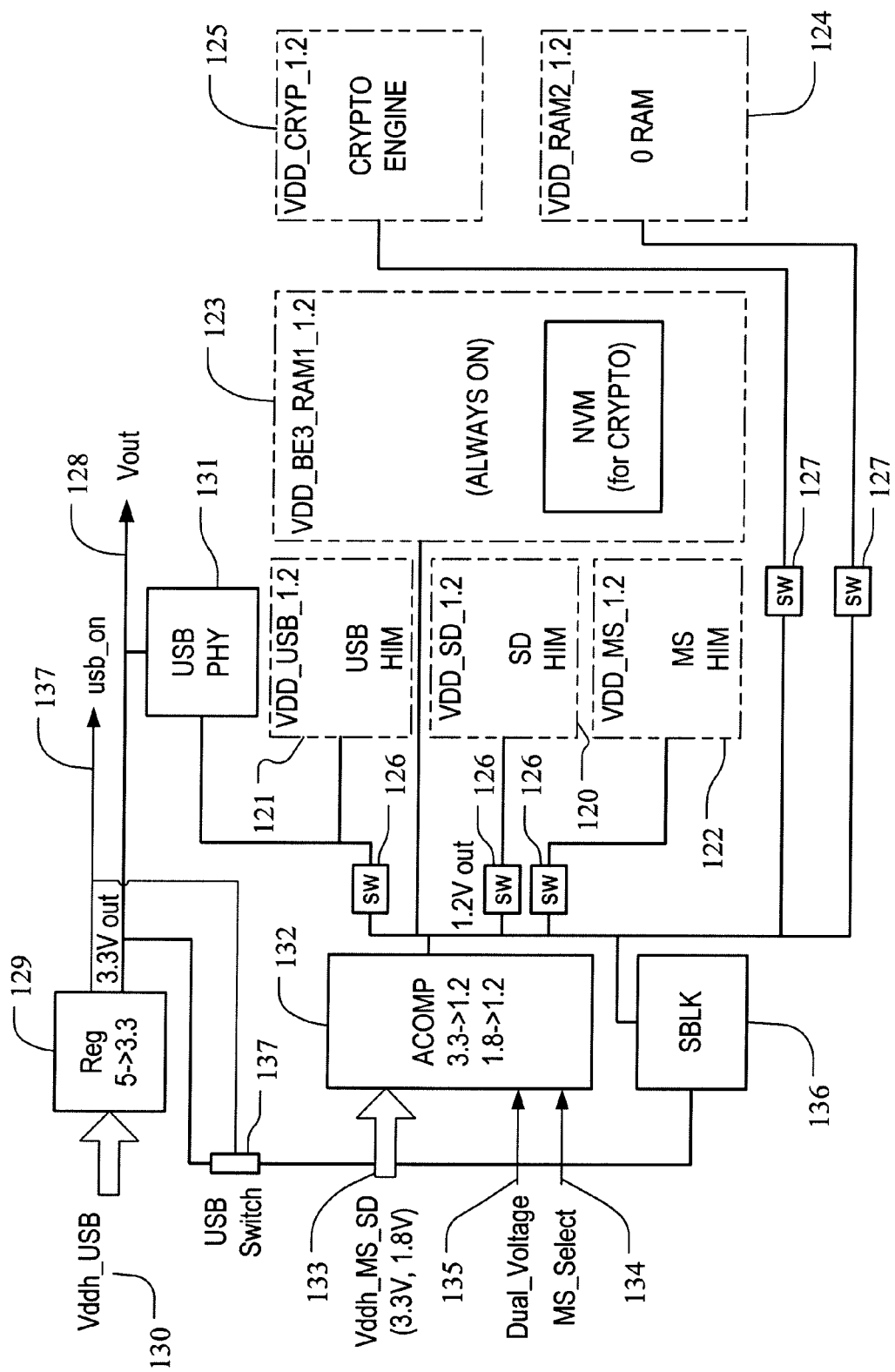
FIG. 1A shows a block diagram of an integrated circuit incorporating the circuit of FIG. 1.

FIG. 1A shows a diagram of an integrated circuit which advantageously includes the circuit of FIG. 1, and FIGS. 1B-1D show a power island diagram of the integrated circuit exemplary embodiment of FIG. 1A.

The exemplary embodiment of FIG. 1A is a multifunction flash memory controller that offers three different external interfaces. Notable features of this embodiment (which are not necessary to the claimed invention) include:

Secure Flash memory controller Back-End with provisions for data transfer over three Host interfaces (SD/MMC (Secure Digital/Multimedia Card) 120, USB (Universal Serial Bus) 121, and MS (Memory Stick) 122, though only one host interface is used at a time.

Partitioning into six voltage islands (SD/MMC HIM (Host Interface Module) 120, USB HIM 121, MS HIM 122, Always ON (Back End, MRAM (Magnetic Random Access Memory), Pad control, and Power Management) 123, ORAM (Overlay Random Access Memory) 116, and Crypto Engine 125.

No power consumption overhead, standby or active, from the logic in two powered-down Host interfaces. The power islands with the powered down host interfaces, or OFF Islands, are isolated from power voltage supply (VCC) and ground (GND) by switches 126 so no current can flow.

The power islands with ORAM 124 and Crypto Engine 125 are switched ON or OFF using switches 127.

Partial-chip power-down functionality can be achieved with controlled analog power switches for each island (except Always ON), and isolation gates can be used to prevent invalid signals from powered-down islands from reaching inputs of the powered-on islands.

Dynamic island control can power-down ORAM 124 and Crypto Engine 125 modules during standby to achieve spec requirements for standby current (SD/MMC represents minimum spec).

Register control of analog block standby-power reduction includes regulator and oscillator standby/disable/low-power modes.

Top-level logic detects and configures a single Host interface to the Back-end, and to power down the remaining two Host interface voltage islands. Detection result register is available to FIRMWARE boot ROM.

Preferably, dynamically controlled individual power islands (e.g., Crypto Engine 125 and ORAM 124) each include their own POR circuits detecting whether power to that island is valid. These can be implanted within the power islands and may encompass multiple PORs to ensure fully valid power throughput the power island. The chip must regulate the host power supply to provide a core voltage of 1.2V for internal logic. In SD, MMC, or MS operational modes, the host provides a 3.3V or 1.8V supply. In many embodiments, a portion of the current supplies the input/output (I/O) pads on the chip (VDDH 130, etc.) and any external memory, while the remainder is regulated by an internal core regulator to provide a 1.2V supply to the core logic on the chip.

In the exemplary chip depicted for USB, an additional regulation step is required before the core regulator. The USB Host (i.e. VDDH USB) 130 provides a 5V supply to 5-3.3 Regulator (REG) 129, which is regulated to 3.3V then provided to the internal core regulator referred to above, and in USB mode, the 3.3V output of the 5-3.3 Regulator 129 (i.e., VOUT 128) which is provided to USB PHY (physical layer). When no 5V VDDH USB 130 is present, the power bus is switched using a switch (SW) 126 to isolate the USB PHY 131 and USB HIM 121 modules.

The Analog Component Interface (ACOMP) 132 controls the switching to select USB mode to configure the power routing for USB mode when 5V power (e.g., 3.3 volts) is detected on the USB host interface. The ACOMP can possess a POR and the generated logic can play a critical role in determining when the USB power supply is considered stable, and thus when USB switching occurs to power up the USB HIM 121. The ACOMP 132 also detects the VDDH MS SD 133 3.3 or 1.8 V supply voltage to configure for MS or SD mode operation, controlling the USB Switch 137 and switches 126. The ACOMP 132 also supports dual voltage power of 3.3V or 1.8V based on a Dual Voltage logic input 135. The ACOMP 132 logic configures for either SD or MS mode when appropriate 3.3V or 1.8V is detected based on the MS Select logic input 136. The SBLK logic module 136 provides auxiliary functions to the Crypto Engine 125.

The on-chip power supply detection can automatically detect if the USB supply is being used. If so, it routes the USB host power to the appropriate internal regulators and logic blocks. If instead, the chip is operating in SD/MS modes, the switch will block the supply from flowing back into the USB and only power to be routed to the appropriate regulator and logic blocks used by SD/MS modes occurs.

When the USB host supply is active, this is detected by an (inverter) comparator which then turns on the unidirectional power switch so that the 3.3V supply produced by the 5-3.3V regulator can be routed to another regulator which can be used to generate the 1.2V supply needed for core logic. In addition, the output indicator 'usb_on' 137 will be asserted and the correct host interface logic for USB operation will be selected. If however, the chip is not receiving power from its USB power port but from its SD/MS port, then the (inverter) comparator will turn off the switch and only let the SD/MS supply be used to generate the 1.2V needed by the SD/MS core interface logic.

A POR circuit can be implemented that detects the 3.3V or 1.8V source and operate accordingly. Although the core logic would only receive the regulated 1.2V power, a POR can be configured to detect the 3.3V or 1.8V supply to reset the chip island till the appropriate voltage is reached. This may be needed to prevent the circuit from attempting to operate based on a 1.8V supply when the supply voltage is actually 3.3V.

Power Islands

Figure 1B:
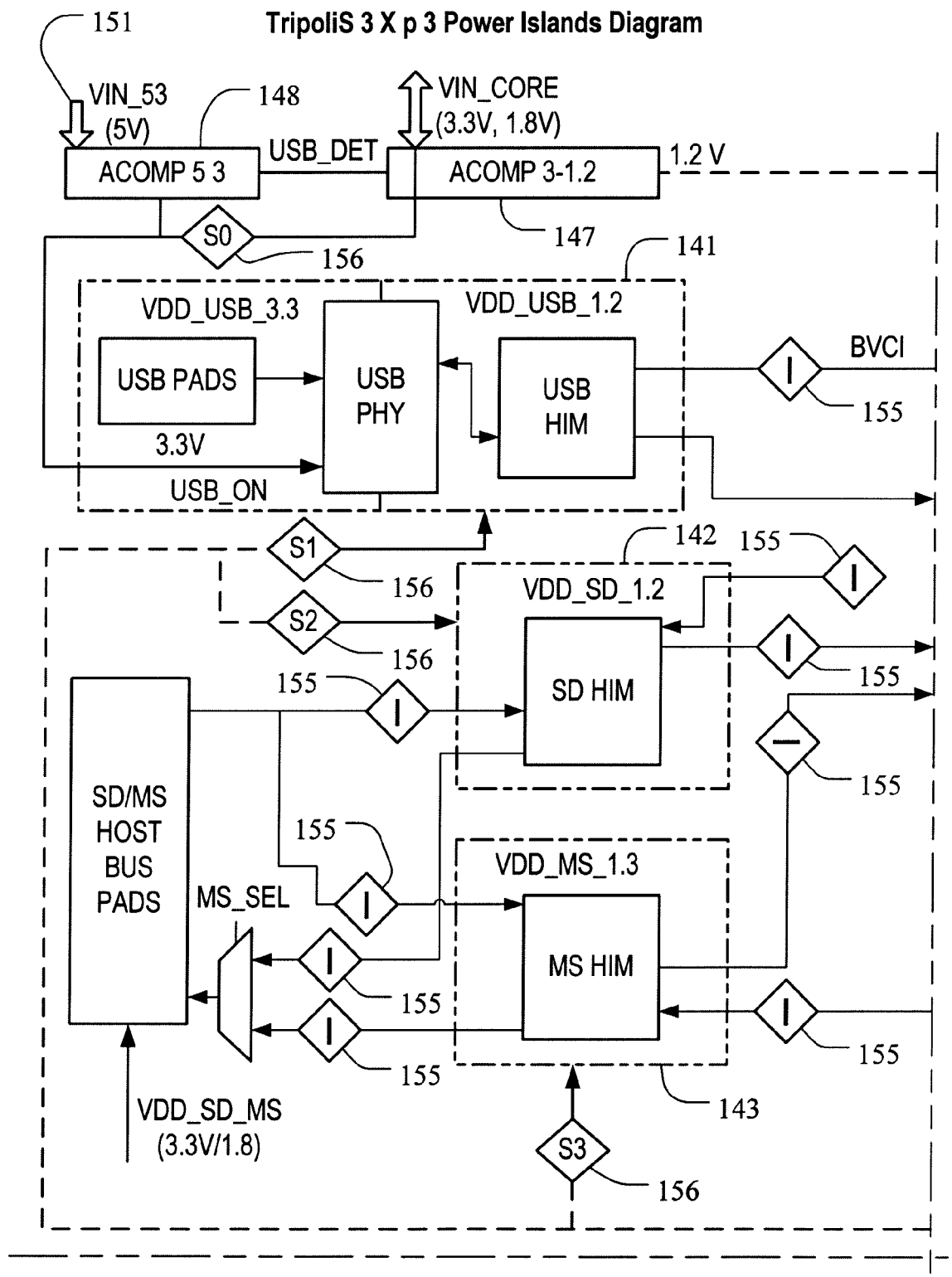
FIGS. 1B-1D show a power island diagram of the integrated circuit of FIG. 1A.
Figure 1C:
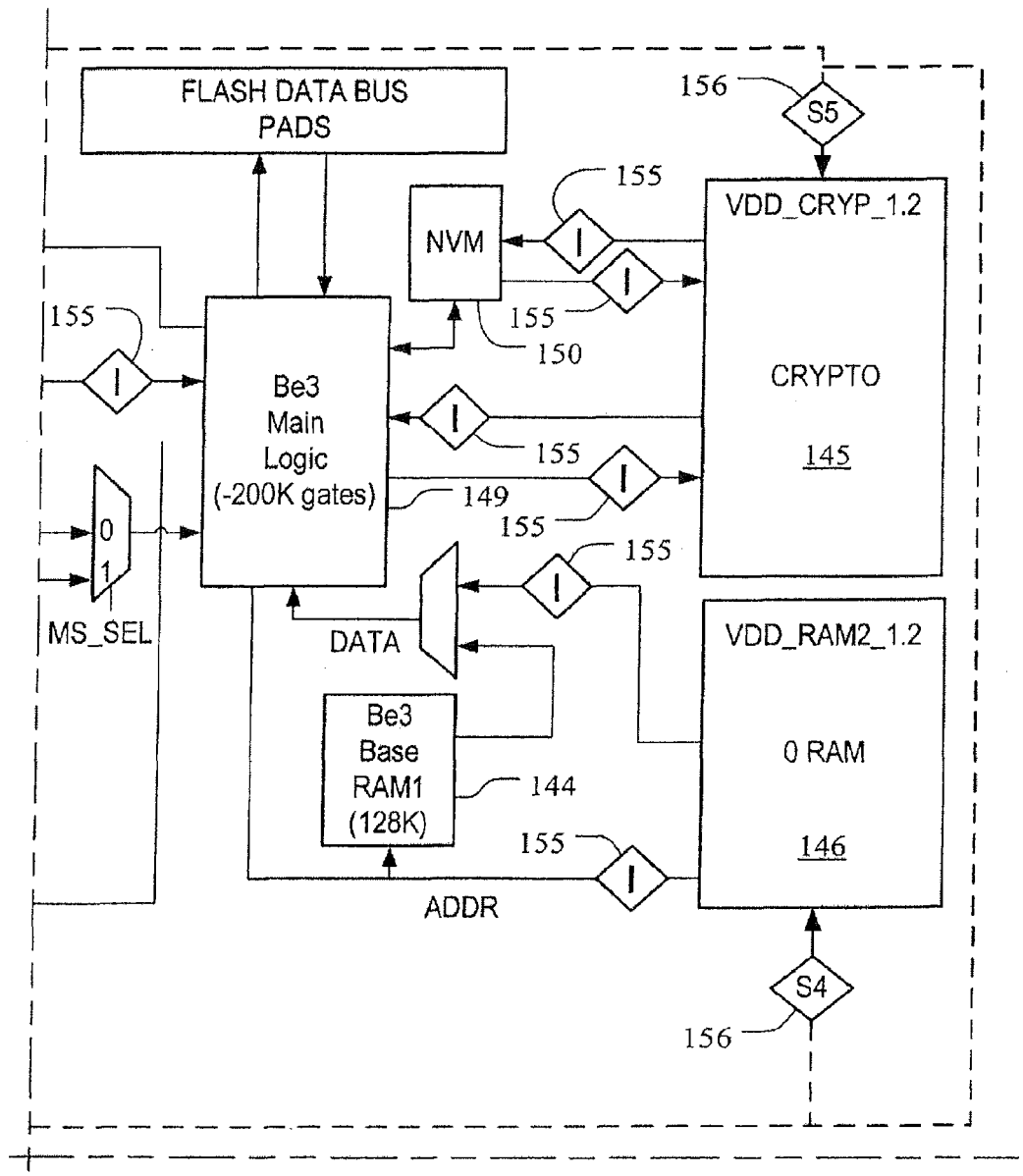
Figure 1D:
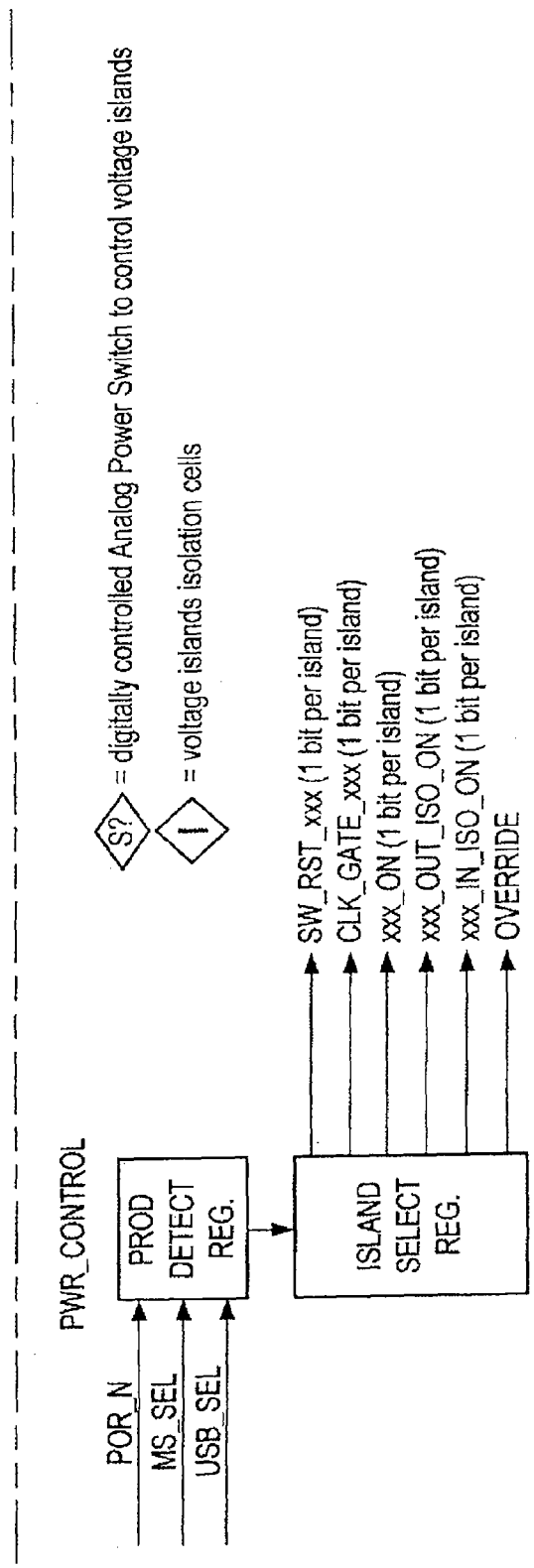

The exemplary embodiment of FIGS. 1B-1D is an integrated circuit implementation of power islands as seen in FIG. 1A. Voltage islands refer to sections of the chip electronically coupled for selective powering on/off independently from other areas of the chip to minimize the total power usage during non-operation, standby, or test modes. The architectural goal implements voltage islands for blocks that can be most cleanly shut-off. Five blocks are identified as power islands: USB HIM 141, SD HIM 142, MS HIM 143, Crypto Engine 145 and ORAM 146. All remaining logic including the remaining system RAM 144, analog modules (ACCOMP) 147 and 148, and main logic 149 are always on. Fewer or additional blocks are possible.

Static HIM Selection

Three power island blocks 141, 142 and 143 represent three different host interfaces. They are implemented as static power islands in the sample embodiment such that only one HIM is active at a time in the design. For example, the entire USB HIM 141 and MS HIM 143 could be statically (permanently) powered down at FW Boot time for an SD product configuration. In such a situation, there is no need to offer dynamic switching among these three HIMs, therefore, the design can implement a static HIM configuration at power-on, and upon de-assertion of POR, only one selected HIM shall be permanently configured until the next full power cycle. In any event, POR can be implemented in all of the HIM power islands.

In an exemplary embodiment, the HIM island control can be handled automatically in hardware. From the firmware standpoint, after power-up, the static island configuration is complete, and the product has become one of the three controller types (SD/NMC or MS or USB), with respective HIM_ON bit set in the Power Island Control Register (see FIG. 3).

By the time the CPU comes out of its POR, and firmware (ROM) is executing, the correct host interface is available (its island is powered on), and firmware reads the HIM ID register, and begins executing the appropriate code for that interface. A Power Island Control Register 150 in the CPU (not shown) determines which power switches are opened to supply the 1.2V core voltage to the named islands.

Note that in this exemplary embodiment, the BE 3 Main Logic island 149 must be ON for the CPU to be powered, thus enabling firmware (ROM) in the CPU to boot the system. This bit is considered reserved because the BE 3 Main Logic island 149 includes all the Power Island Control logic and is always on, and cannot be shut-off through this register or otherwise. Other embodiments may support power-down of the BE Main Logic island 149 with the always on power island control being separated out.

Figure 3:
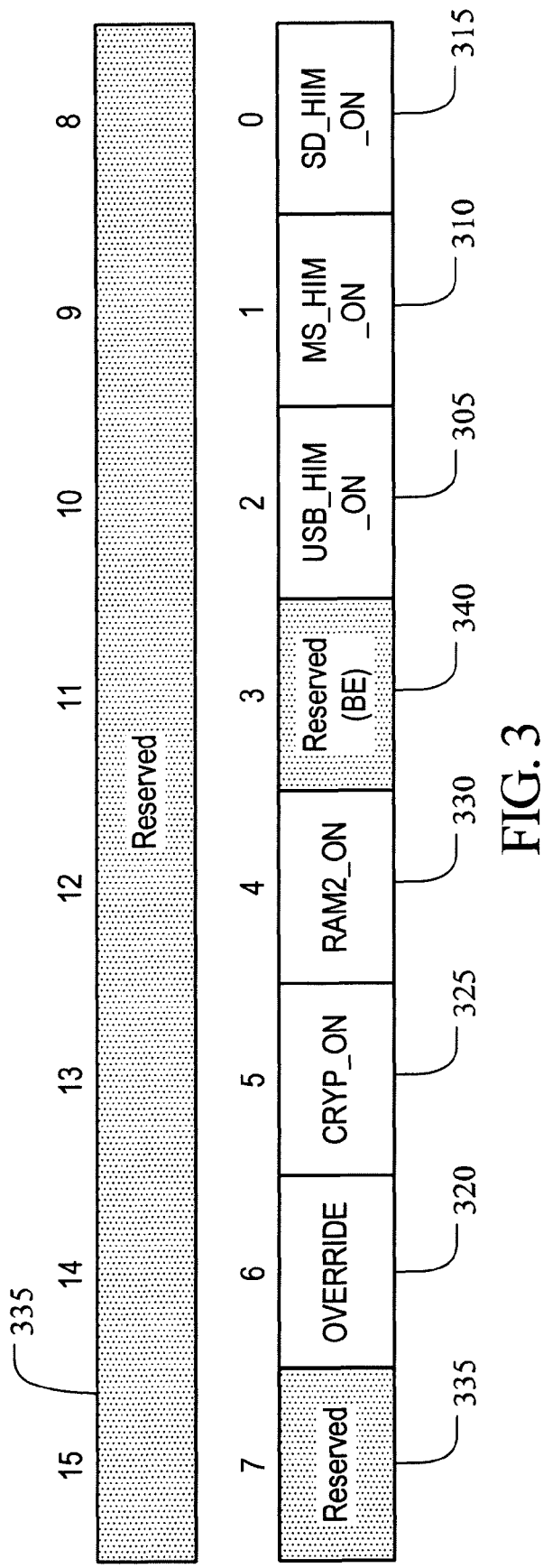
FIG. 3 shows a Power Island Control Register used for island configuration.

Referring to FIG. 3, the low-order three bits of the Power Island Control Register (USB_HIM_ON 305, MS_HIM_ON 310, and SD_HIM_ON 315) are set by hardware as described above, and are considered READ-ONLY in this exemplary embodiment. Values can be assigned by selecting the OVERRIDE bit 320.

The two bits, CRYP_ON 325 and RAM2_ON 330, are not hardware controlled and do not require OVERRIDE to be set in this exemplary embodiment. Rather, they are firmware controlled for Dynamic Island switching described below. Bit 340 is reserved, but in certain other embodiments could control the BE Main Logic island assigned BE_ON. Bits 435 are reserved.

Dynamic Island Control

On the other hand, on the right side of FIG. 1C are two blocks 145 and 146 representing the Crypto module and overlay RAM (ORAM). The chip boots up with both islands powered off to minimize the startup power consumption. Upon entering operational mode, the firmware can then enable these islands on demand. While some standby power is reduced by statically powering down the two unused HIMs at power-up, the bulk of the standby power savings is achieved by powering down these two large blocks 145 and 146.

Crypto Engine

The Crypto Engine 145 is the hardware-accelerated Security engine that has been integrated into the chip architecture. This module contains almost half the logic of the entire chip design and consumes a corresponding amount of power. The module was designed to power down in this embodiment such that no state preservation is needed. The Crypto Engine 145 block fetches and stores keys in the Non-Volatile Memory (NVM) 150 which cannot be lost due to power down. In this embodiment, NVM 150 is implemented in the ALWAYS_ON domain and will remain powered on at all times. When the Crypto Engine 145 is powered down, no security operations may be performed. While the security keys are preserved in NVM 150, the circuitry to access the key is in the Crypto Engine 145, which must be powered on for any operations requiring the keys.

ORAM

ORAM 146 is the overlay RAM for control firmware. In the exemplary embodiment, this ORAM consist of nearly half of the entire RAM present in the controller. The ORAM 146 is typically used for code overlay paging. In this sample embodiment, the system firmware locates island management code (power-down and power-up routines) in other ALWAYS_ON memory such that it is immediately available to respond to a host command coming out of sleep mode. Note that when the ORAM 146 is powered off, the contents of the RAM cells will discharge, and the stored values will become unknown and random. Therefore, when the ORAM 146 is powered on, the contents should be considered invalid, and must be discarded. The ORAM 146 contents can be restored by streaming in portions as needed, so the ORAM 146 island power-up and reload timing does not directly impact critical firmware response time.

In this exemplary embodiment, unlike the static HIM islands 141, 142, and 143 configuration, which is controlled completely by chip hardware, the dynamic control for the Crypto 145 and ORAM 146 islands includes hardware control and status registers that require firmware control. This provides greater flexibility in power island implementation. A few of the advantages offered by this arrangement are listed below:

Allows full programmability of power island usage. Any implementation may choose to power down Crypto 145, ORAM 146, both or neither, as needed for the particular implementation. By decoupling this feature from the interface type (e.g., SD, USB, MS), different sub-variants within these three categories may trade off the power savings for possible performance and/or complexity benefits.

Firmware completely controls when to enter the power saving mode, choosing to complete operations first, or it may begin shutting down one island while finishing up activity on the other. Additionally, the two islands may be turned on/off in any order.

Since powering down and powering up these two blocks significantly impacts standby current, the firmware can optimize how power is removed or applied through analog power switches with fine timing control with respect to settling time and impact on the rest of the chip logic.

Logic isolation, clock-gating, and POR mechanisms are provided for each island and can include multiple POR circuits on the power island. Firmware has control of the order and usage of these mechanisms through programmable registers.

Island Control Mechanisms

Once the logic and RAM have been logically partitioned into discrete islands, several mechanisms must be added to control the islands and enable standby power savings under the necessary mode configurations and conditions:

System Core power gating and control (Host supply regulation and Analog power isolation switches).

Product package detection (SD/MMC, USB, or MS module configuration).

Logic Gate Isolation Control (ON-Island isolation from OFF-island(s) effects) (In the embodiment, voltage isolation cells 155 accomplish logic gate isolation).

System Core Power Gating and Control

In the exemplary embodiment, the chip handles three major power functions:

Regulation of host-supplied power from either a (3.3V or 1.8V) SD/NMC or MS host, or a (5V) USB host.

Switching the supply lines to the required power islands based upon the static (product configuration) and dynamic island control (for standby suspend and resume) of the Crypto 145 and ORAM 146 power islands.

Island Supply switching control and status—analog power switching must minimize impact on system core power. (In the embodiment, digitally controlled analog power switches 156 accomplish powering switching).

Host Supply Regulation

Figure 1E:
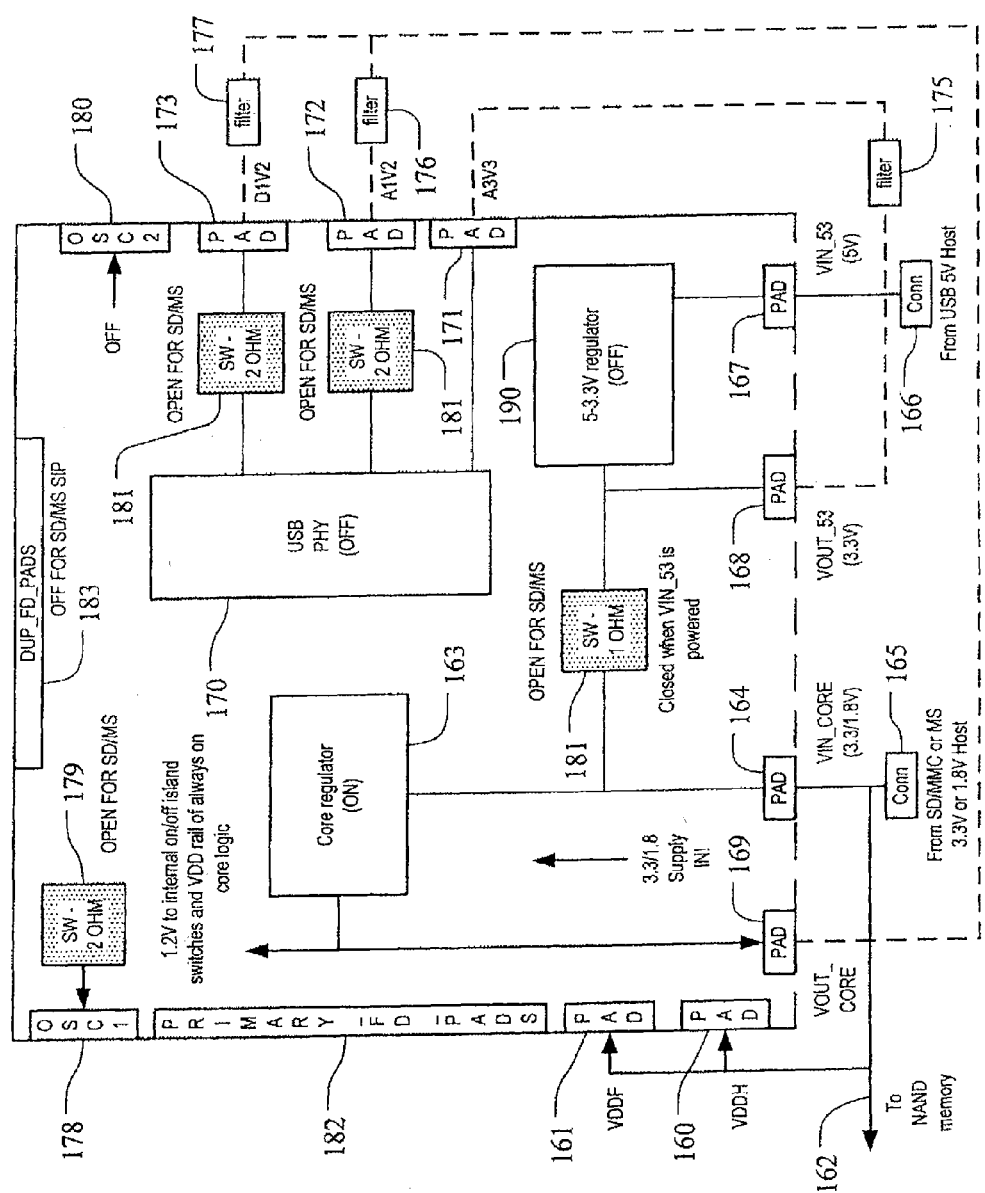
FIG. 1E shows the power status of different portions of the integrated circuit in a non-USB mode.
Figure 1F:
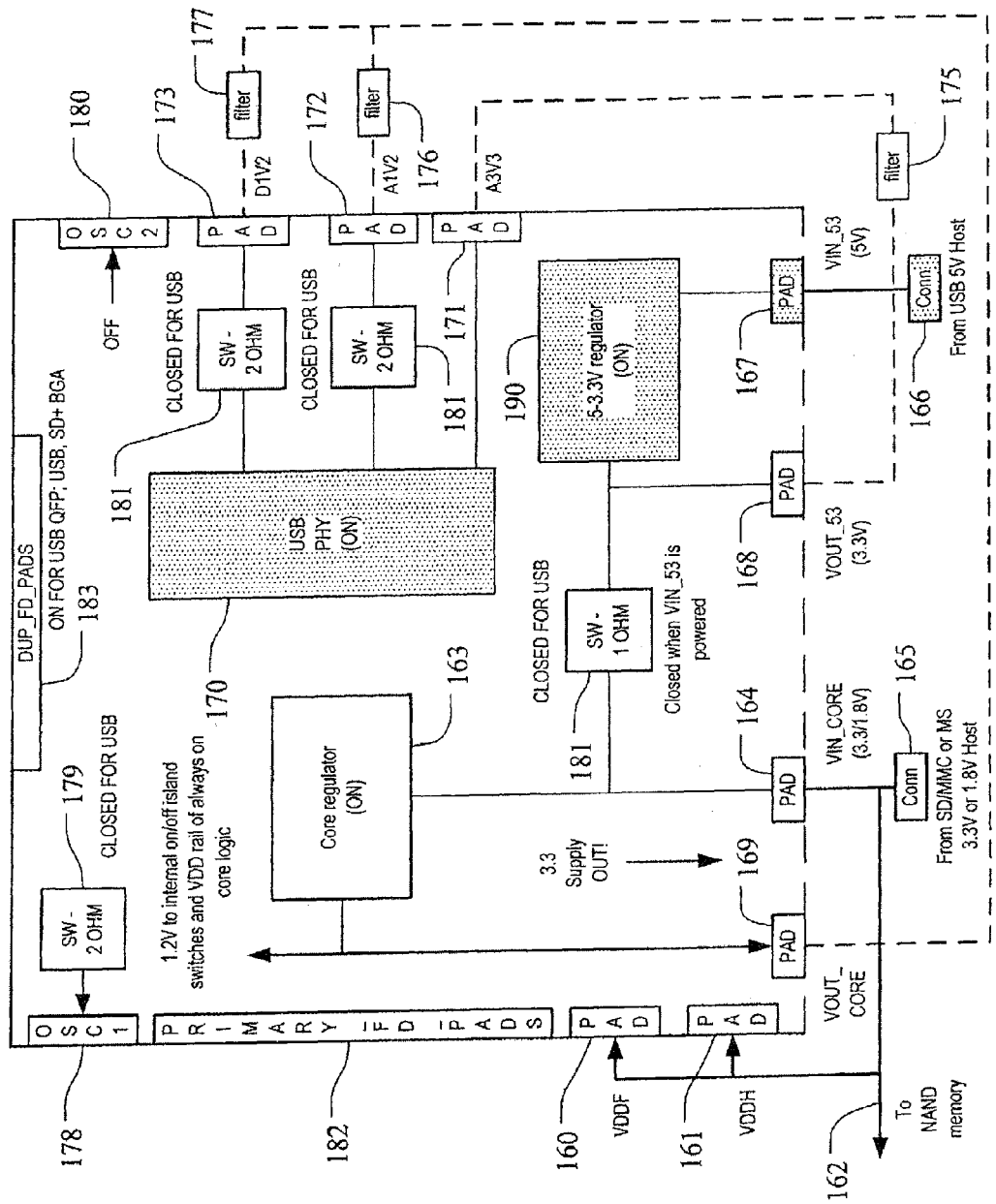
FIG. 1F shows the power status of different portions of this integrated circuit in USB mode.

FIG. 1E and FIG. 1F show further details of the power supply. In the exemplary embodiment of FIG. 1E, operation in non-USB mode is shown. The chip regulates the Host supply to provide a core voltage of 1.2V for internal logic.

In SD, NMC, or MS modes, the Host provides a 3.3V or 1.8V supply. A portion of this current supplies the I/O pads on the chip (VDDH 160, VDDF 161), as well as the external NAND memory 162, while the remainder is regulated by an internal Core Regulator 163 to provide a 1.2V supply to the core logic (VIN_CORE 164).

In non-USB mode, the SD/MMC or MS Host provides 3.3 or 1.8 V supply 165 (VIN_CORE 164), which is supplied to the Core Regulator 163. In USB mode, the USB Host 166 requires an additional regulation step before the Core Regulator 163. The USB Host 166 provides a 5V supply (VIN_53 167), which is first regulated to 3.3V by the 5-3.3 Regulator 190 then provided to the internal Core Regulator 163 mentioned above.

Additionally, when in USB mode, the 3.3V output of the 5-3.3 Regulator 168 and the 1.2V output of the Core Regulator 163 are driven out of the chip (on VOUT_53 168 and VOUT_CORE 169 respectively) where they are filtered by filters 175, 176, and 177 and then provided to USB PHY 170 supply inputs (A3V3 171, A1V2 172, and D1V2 173).

In the exemplary embodiment of FIG. 1E, operation in non-USB mode is shown. The SD/MMC or MS Host 165 supplies power to the Core Regulator 163. The USB oscillator (OSC1 178) is not needed, so switch 179 is open. The second oscillator (OSC2 180) is OFF, and the USB Switch 181 is open. The 5/3V Regulator 190 is OFF. The PHY interface (3.3V) 170 is powered down, so USB PHY Core Switches 181 are open. The Primary FD pads 182 are active, and the FD_DUP pads 183 are not.

FIG. 1D shows the power status when the USB HIM is active. The chip regulates the host supply to provide a core voltage of 1.2V for internal logic. The 5/3V Regulator 190 is ON, and the USB Switch 181 is closed. The 5/3V Regulator 190 supplies the Core Regulator 163, and the USB oscillator OSC1 178 is active with the switch 179 closed. The USB physical interface PHY (3.3V) is ON, and the USB PHY Core Switches 181 closed. Some Primary FD pads 182 are OFF, and the duplicate FD_DUP pads 183 are ON.

Host and Regulated Supply Switching

As show above, both types of configurations (SD, NMC, MS v. USB) must function properly with the shared power paths. A third mode may be utilized designated SD+. In the SD+ configuration, both SD and USB power hookups operate at the same time in a unified package and, therefore, presents further challenges to manage the various power supply options.

To limit the active and standby current in the implementations not supporting USB, the power bus is switched to isolate the USB PHY and USB device core when no 5V Host supply is present.

The 1.2V Core voltage is switched off for the two HIM islands that are not in use for each implementation.

The Crypto block 145 and ORAM block 146 may be independently switched on and off dynamically to save standby power.

USB HIM Power Switching

Mode Detection is based on power applied to the ACOMP_54 148 or ACOMP_3-1.2 147. ACOMP logic determines which single Host Interface (MS, SD/MMC, or USB) is currently selected.

Power Islands—Island Switching

Once the Mode is determined, ACOMP logic will enable the appropriate voltage islands for that mode.

Isolation Cells

Isolation cells 155, when switched on, prevent undefined floating logic state from propagating from an un-powered island to the rest of the chip. Isolation cells when enabled will decouple the source and destination points and present either a fixed high voltage (logic 1) or fixed low voltage (logic 0) value or retain the last state on the signal (latch-based). When isolation cells are disabled the cell will just pass the output signal state through between source and destination.

There are two separate isolation cell control registers (island inputs, island outputs).

The isolation cells at the inputs of an island will always be 'logic 0' based cells so that when the island is powered off there is no voltage present at the powered off inputs.

The isolation cells at the outputs of an island are chosen based on benign state such that when the island is shut off the corresponding destination island input will still see benign state.

Firmware Issues from Power Islands

Firmware must manage Crypto island 145 power disable/enable to achieve SD standby mode limits. Firmware must manage code restoration (re-loading) to the ORAM island 146, which must also be powered down for SD standby mode.

Figure 2:
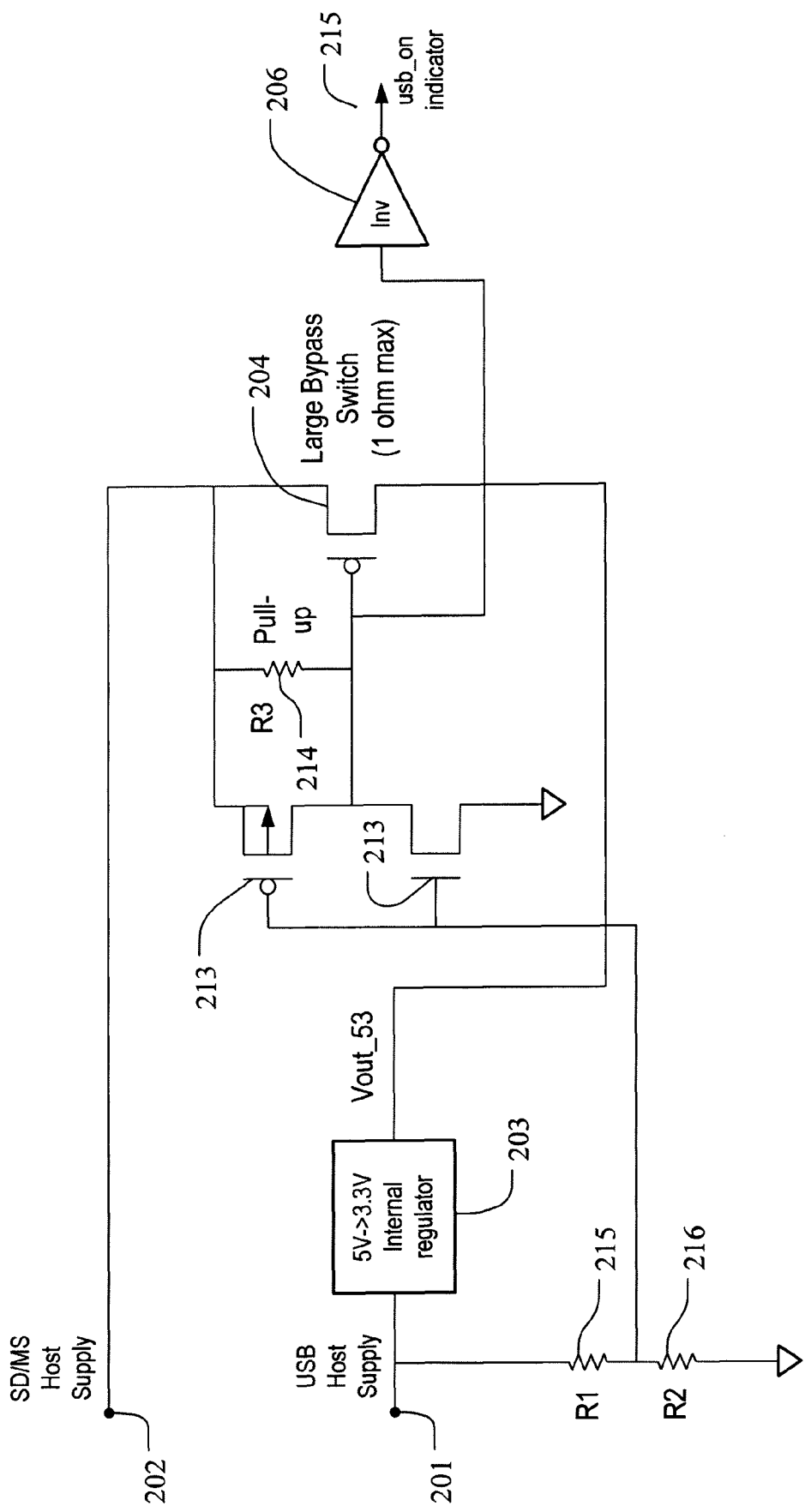
FIG. 2 shows further details of the implementation of the circuit of FIG. 1.

FIG. 2 shows further details of the implementation of the circuit of FIG. 1. In this embodiment the USB power detector block is simply an inverter 206, so it will provide an active-low output to the following inverter stage as soon as the quantity $V_{USB\_Supply} R_2/(R_1+R_2)$ rises above the N-channel threshold voltage $V_{TN}$. Since $V_{TN}$ is typically half of the bandgap reference voltage $V_{BG}$ (or less), this means that the inverted voltage USB On will begin to come up long before the Host POR signal reaches the valid value. Typically, the power-on reset signals are active-low, i.e. the chip or circuit is held in reset by a low value of the POR signal.

This figure also shows some details of the relation between the USB Host Supply 201 and the SD/MS Host Supply 202 connection. The USB Host Supply 201 (5V nominal) drives a regulator 203, which derives a regulated 3.3V supply from the USB Host Supply 201. If USB_On 215 is high, the illustrated large PMOS bypass switch 204 will be turned on (by the preceding low voltage), so that the output of Regulator 203 is connected to drive the SD/MS Host Supply 202 connection. This line in turn feeds an internal regulator comprising two transistors 213 and resistor 214. A voltage divide formed by resistors 215 and 216 provides power to the gates of transistors 213.

Multi-HIM Interface to Back-End

The sample embodiment of FIG. 3 offers three Die-level selectable HIM interfaces (Front-ends) connected to a single Back-end (BE). This is provided through two available internal interfaces to the BE:

HDMA 320 (Host Direct Memory Access) interface for CF 351, MS 352 and SD/NMC device controller 353, and BVCI 330 (Basic Virtual Component Interface) bus for USB device controller 354. The BVCI port 330 to the BMU is dedicated to the USB device controller, but the HDMA 320 interfaces of the SD/MMC HIM and the MS HIM 352 must be Muxed 340 into a single HDMA port in the BMU.

This sample embodiment includes both static and dynamic islands. The static islands are always off, in operation, if they correspond to a mode of operation which was not selected.

Data Module

Figure 4:
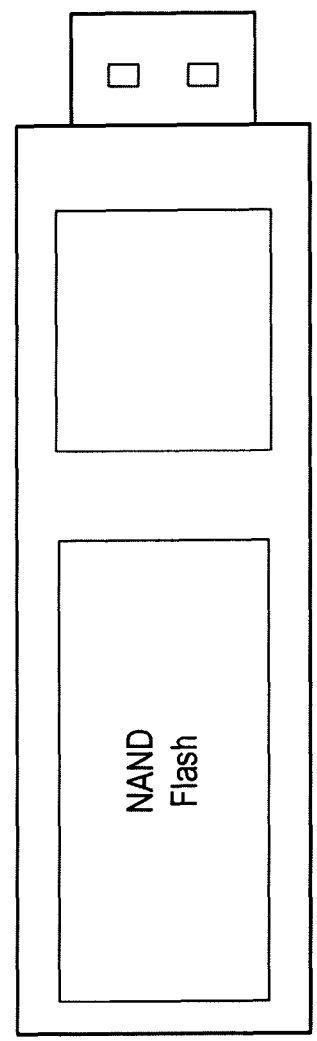
FIG. 4 shows an embodiment of a data module.

FIG. 4 shows a data module. The data module includes a NAND flash memory and controller. The controller, in this sample embodiment, provides a USB interface at the module's connectors, and interfaces to the memory chip with appropriate standards.

According to various disclosed embodiments, there is provided: An integrated circuit comprising: a plurality of power islands, independently connected to receive an interruptible supply voltage; multiple ones of power islands each including respective local power-valid measurement circuits, and also including core circuits which are connected to be conditionally disabled by said respective power-valid measurement circuit; wherein, in at least one of said power islands, said respective supply voltage can assume either of at least two valid ranges, and said respective power-valid measurement circuit includes automatic voltage scaling to test either of said valid ranges.

According to various disclosed embodiments, there is provided: An integrated circuit comprising: a plurality of power islands, independently connected to receive an interruptible supply voltage; multiple ones of said power islands each including respective local power-valid measurement circuits, and also including core circuits which are connected to be conditionally disabled by said respective power-valid measurement circuit.

According to various disclosed embodiments, there is provided: An integrated circuit comprising: a plurality of power islands, independently connected to be powered on or off; wherein one or more of said power islands are dual-voltage power islands which can receive multiple possible supply voltages in different modes of operation; each said dual-voltage power island including selection circuitry which automatically scales a supply voltage input differently, depending on what voltage appears at an external connection, to produce a scaled voltage; and a hysteretic comparator which measures said scaled voltage, and outputs a power valid signal accordingly.

According to various disclosed embodiments, there is provided: An integrated circuit comprising: power control circuitry, which is connected to independently allow or disallow power to a plurality of power islands; multiple ones of said power islands each including respective local power-valid measurement circuits, and also including core circuits which are connected to be conditionally disabled by said respective power-valid measurement circuit; wherein one or more of said power islands are dual-voltage power islands which can receive multiple possible supply voltages in different modes of operation; each said dual-voltage power island including selection circuitry which automatically scales a supply voltage input differently, depending on what voltage appears at an external connection, to produce a scaled voltage; and a hysteretic comparator which measures said scaled voltage, and outputs a power valid signal accordingly, to enable or disable core circuitry within that respective power island.

According to various disclosed embodiments, there is provided: An integrated circuit comprising: a comparator connected to test an input voltage against a reference voltage; at least two external supply voltage connections; and a detection circuit connected to detect power on a first one of said external supply voltage connections, and to provide a corresponding logic output; and a multiplexer which, in dependence on said logic output, connects said input voltage to either a first fraction of the voltage on said external supply voltage connection, or else to a second fraction of the voltage on said second external supply voltage connection; said comparator being operatively connected to provide a power-valid signal.

According to various disclosed embodiments, there is provided: A portable data module, comprising: a memory chip; and a memory controller chip which is connected to external interface terminals and also connected to control said memory chip, and which includes power control circuitry, which is connected to independently allow or disallow power to a plurality of power islands on said controller chip; multiple ones of said power islands each including respective local power-valid measurement circuits, and also including core circuits which are connected to be conditionally disabled by said respective local power-valid measurement circuit; wherein one or more of said power islands are dual-voltage power islands which can receive multiple possible supply voltages from at least one of said external terminals; each said dual-voltage power island including selection circuitry which automatically scales a supply voltage input differently, depending on what voltage appears at an external connection, to produce a scaled voltage; and a hysteretic comparator which measures said scaled voltage, and outputs a power valid signal accordingly, to enable or disable core circuitry within that respective power island.

According to various disclosed embodiments, there is provided: a power on reset circuit, comprising: a voltage detection circuit coupled to at least two external power inputs, the voltage detection circuit configured to detect voltage at a first one of said external power inputs receiving power from an external source; a multiplexing circuit that operatively couples a selected one of said external power inputs to a test node; and a comparator with a first input coupled to a reference voltage, a second input linked to said test node, and an output which provides a power valid signal accordingly; whereby said power-valid signal can enable core circuit operation when the voltage from either external source reaches a respective valid level.

According to various disclosed embodiments, there is provided: A method for operating an integrated circuit comprising the actions of: in on-chip power control circuitry, allowing or disallowing power to a plurality of power islands, independently; in multiple ones of said power islands, locally performing a power-valid measurement, and conditionally disabling respective core circuits of said respective power island in dependence on said respective power-valid measurement; and in some dual-voltage ones of said power islands, detecting which of at least two valid supply voltage ranges is present, and performing said power-valid measurement in dependence thereon.

According to various disclosed embodiments, there is provided: A method for operating an integrated circuit comprising: comparing an input voltage against a reference voltage; detecting the presence of power or not on a first one of two external connections on a voltage detection circuit to provide a logic output; and performing said comparing step with said input voltage connected, as determined by said logic output, to either a first fraction of the voltage on said first external connection or to a second fraction of the voltage on said second external connection; and providing a power-valid output in dependence on said comparing step, as affected by said connecting step.

According to various disclosed embodiments, there is provided: A method for validating power to an integrated circuit having a plurality of power islands, comprising: selecting one or more power islands to power on using one or more logic controlled switches; and within a power island, controlling logic operation using a power-validation circuit to validate an input voltage, wherein said power-validation circuit uses a comparator to test a fraction of said input voltage against a reference voltage, detecting the presence of power on a first one of said external connections, and switching the input to said comparator to change said fraction accordingly; whereby said integrated circuit is multi-supply-voltage compatible, in at least one said power island thereof.

According to various disclosed embodiments, there is provided: A method for validating voltage on a power island, comprising: selecting power islands to power on using one or more logic controlled switches; controlling logic operation of at one least power island using a power on reset circuit, in said one power island, to validate a supply voltage received thereat; wherein said power on reset circuit tests a fraction of said input voltage against a derived reference voltage; detecting the presence or absence of voltage on a first one of at least two external power input connections to said one power island, and reconfiguring said power on reset circuit to change said fraction and to connect to a selected one of said two external power input connections accordingly.

According to various disclosed embodiments, there is provided: an integrated circuit comprising: a comparator connected to test an input voltage against a derived reference voltage; at least two external power input connections connected to a detection circuit detecting power on a first one of said external power connections that provides a logic output; a logic switch which, in dependence on said logic output, connects said input voltage to either a first fraction of the voltage on said first external connection, or else to a second fraction of the voltage on said second external connection; said comparator being operatively connected to provide a power-valid signal.

According to various disclosed embodiments, there is provided: a circuit for ensuring valid power for logic operation of a digital circuit, comprising: a first comparator receiving a first test voltage signal derived from a selected voltage source at a first input, and receiving a reference voltage at a second input; and the comparator generating a logic output signal to indicate a valid voltage range used to connect to either of a valid first voltage source or a valid second voltage source, said connected voltage source providing power to internal core logic.

According to various disclosed embodiments, there is provided: a power on reset circuit, comprising: a voltage detection circuit coupled to at least two external power inputs, the voltage detection circuit configured to detect voltage at an input first receiving power from an external source; a comparator with a first input coupled to a reference voltage, an output power reset signal, and a second input linked to the at least two external power inputs; a logic control switching circuit that couples the comparator's second input to said input first receiving power from an external source, the voltage on said second input proportionally derived from the external source; and said output power reset signal providing a power-valid signal based on the derived voltage from the external source reaching a valid level.

According to various disclosed embodiments, there is provided: a power on reset circuit, comprising: a voltage detection circuit coupled to at least two external power inputs, the voltage detection circuit configured to detect voltage at an input first receiving power from an external source; a comparator with a first input coupled to a reference voltage, an output power reset signal, and a second input linked to the at least two external power inputs; a logic control switching circuit that couples the comparator's second input to said input first receiving power from an external source, the voltage on said second input proportionally derived from the external source; and said output power reset signal providing a power-valid signal based on the derived voltage from the external source reaching a valid level.

According to various disclosed embodiments, there is provided: a valid voltage detection circuit, comprising: a comparator with a first input from an analog multiplexer and a second input from a reference voltage source, the comparator generating an on power reset signal output; an analog multiplexer with a third input proportional from a first voltage source, a fourth input proportional from a second voltage source, the first output derived from one of the first voltage source or the second voltage source; a power detector coupled to the second voltage source and providing a fifth input to the analog multiplexer, wherein when the power detector detects a threshold voltage from the second voltage source, a power on signal is generated to the fifth input; and said analog multiplexer reacts to the power on signal fifth input by selecting the fourth input, and in the absence of the power on signal selecting the third input, the selected input voltage signal received at the first input, whereby when the first input voltage reaches a specified level, the power reset signal output occurs.

According to various disclosed embodiments, there is provided: a method for operating an integrated circuit comprising: comparing an input voltage against a reference voltage; detecting the presence of power or not on a first one of two external connections on a voltage detection circuit to provide a logic output; and connecting, as determined by said logic output, as said input voltage, to either a first fraction of the voltage on said first external connection or to a second fraction of the voltage on said second external connection.

According to various disclosed embodiments, there is provided: a method for validating power to a logic circuit having a plurality of power islands, comprising: selecting one or more power islands to power on using one or more logic controlled switches; controlling logic operation of a power island using a power on reset circuit to validate a threshold input voltage; using a comparator to test a fraction of said input voltage against a derived reference voltage; configuring the comparator to test at least two external power input connections, and a voltage detection circuit connected to detect the presence of power on a first one of said external connections; and providing switching logic which, in dependence on the logical output of said voltage detection circuit, connects said input voltage to either a first fraction of the voltage on said first external connection, or else to a second fraction of the voltage on said second external connection, with said comparator being operatively connected to generate a power-valid signal when a threshold voltage is detected.

According to various disclosed embodiments, there is provided: a method for validating voltage on a power island, comprising: selecting one or more power islands to power on using one or more logic controlled switches; controlling logic operation of a power island using a power on reset circuit to validate a valid input voltage on a first power island; using a comparator to test a fraction of said input voltage against a derived reference voltage; configuring the comparator to test at least two external power input connections to a first power island, and a voltage detection circuit connected to detect the presence of power on a first one of said external connections; and providing switching logic which, in dependence on the logical output of said voltage detection circuit, connects said input voltage to either a first fraction of the voltage on said first external connection, or else to a second fraction of the voltage on said second external connection, with said comparator being operatively connected to provide a power-valid signal and allow logic operation on a second power island.

Modifications and Variations

As will be recognized by those skilled in the art, the innovative concepts described in the present application can be modified and varied over a tremendous range of applications, and accordingly the scope of patented subject matter is not limited by any of the specific exemplary teachings given. It is intended to embrace all such alternatives, modifications and variations that fall within the spirit and broad scope of the appended claims.

For example, further stages can be added to the various circuits illustrated, while still preserving the logical and/or functional relationships described above. PORs can be implemented for an entire island or portions of an island. PORs may also be implemented to ensure another island is operating with valid power before allowing power-up.

Note that the output signal provided by the power-on reset circuit can be described more generally as a power-valid signal, and indeed the power-on-reset circuit can itself be described as an example of a power monitoring or power validation circuit. The use of a "power-on reset" signal as described above is extremely common in complex digital logic, but other schemes for avoiding unpredictable states can be used instead. (For instance, the signal can be described as an "enable" or "disable" signal, depending not only on how it is connected but also on how it is conceptualized.)

Reference is also made to the following commonly owned and copending U.S. patent applications, each and every one of which is hereby incorporated by reference in its entirety: 60/934,936 filed Dec. 31, 2006; 60/921,507 filed Dec. 31, 2006; 60/934,918 filed Dec. 31, 2006; 60/934,917 filed Dec. 31, 2006; 60/999,760 filed Dec. 31, 2006; 60/934,923 filed Dec. 31, 2006; 60/934,937 filed Jan. 1, 2007; 60/921,508 filed Jan. 1, 2007; Ser. No. 11/618,849 filed Dec. 31, 2006; Ser. No. 11/618,852 filed Dec. 31, 2006; Ser. No. 11/618,865 filed Dec. 31, 2006; Ser. No. 11/618,867 filed Dec. 31, 2006; Ser. No. 11/649,325 filed Dec. 31, 2006; Ser. No. 11/649,326 filed Dec. 31, 2006; Ser. No. 11/967,580 filed Dec. 28, 2007 (SDD-1093, "Systems and Circuits with Multirange and Localized Detection of Valid Power"); Ser. No. 11/966,012 filed Dec. 28, 2007 (SDD-1100, "Optionally Bonding Either Two Sides or More Sides of Integrated Circuits"); and Ser. No. 11/966,147 filed Dec. 28, 2007 (SDD-1102, "Exclusive-Option Chips and Methods with All-Options-Active Test Mode"). None of these applications are necessarily related to the present application, but these help to show features which were designed into the same system as the ideas described above, and/or which combine synergistically with those ideas.

For another example, it is also possible to include local power-monitoring circuits in dynamic power islands (which may be powered up or powered down at various times, while the device is operating, for optimal power efficiency), but not is static power islands (such as the host interface modules in the embodiment described above). This class of embodiments has the advantage that protection is given selectively where it is most needed, i.e. independent protection is given only to islands whose power state is independent. This simplifies design.

None of the description in the present application should be read as implying that any particular element, step, or function is an essential element which must be included in the claim scope: THE SCOPE OF PATENTED SUBJECT MATTER IS DEFINED ONLY BY THE ALLOWED CLAIMS. Moreover, none of these claims are intended to invoke paragraph six of 35 USC section 112 unless the exact words "means for" are followed by a participle.

The claims as filed are intended to be as comprehensive as possible, and NO subject matter is intentionally relinquished, dedicated, or abandoned.

What is claimed is:

1. An integrated circuit comprising:
a plurality of power islands, each power island of the plurality of power islands configured to independently receive an interruptible supply voltage;
wherein at least two power islands of the plurality of power islands each comprise a local power-valid measurement circuit and a core circuit, wherein a core circuit of a power island is configured to be conditionally disabled by a power-valid measurement circuit of the same power island; and
wherein, in a first power island of the at least two power islands comprising a local power-valid measurement circuit and a core circuit, the power-valid measurement circuit is configured to perform automatic voltage scaling to test for each of at least two valid ranges that the interruptible supply voltage received by the power island is configured to assume.

2. The integrated circuit of claim 1, wherein the supply voltage is no more than 5 volts.

3. The integrated circuit of claim 1, wherein the supply voltage is no more than 3.3 volts.

4. The integrated circuit of claim 1, wherein the first power island is configured to implement two different resistive ladders to perform automatic voltage scaling.

5. The integrated circuit of claim 1, wherein the first power island is an external interface control which is operable to be connected to more than one electrical interface.

6. An integrated circuit comprising:
a plurality of power islands, each power island of the plurality of power islands configured to independently receive an interruptible supply voltage;
wherein at least two power islands of the plurality of power islands each comprise a power-valid measurement circuit and a core circuit, wherein a power-valid measurement circuit of a power island is configured to conditionally disable a core circuit of the power island.

7. The circuit of claim 6, wherein each core circuit of the at least two power islands is configured to perform a power-valid output signal enabling logic operation.

8. The circuit of claim 6, wherein each valid-power measurement circuit of the at least two power islands is configured to conditionally output a power-valid output signal to a power island, the power-valid output signal indicating that a power voltage is within a valid range, and wherein each core circuit of the at least two power islands is configured to perform operations based on a power-valid output signal.

9. The circuit of claim 6, wherein the valid-power signal indicates to a first power island that a power voltage is within a valid range, and wherein a core circuit of a second power island performs operations based on the valid-power signal.

10. An integrated circuit comprising:
a plurality of power islands, independently connected to be powered on or off;
wherein at least one power island of the plurality of power islands is a dual-voltage power island which is configured to receive different supply voltages in different modes of operation;
wherein each dual-voltage power island comprises:
selection circuitry configured to produce a scaled voltage by automatically scaling a supply voltage input based on a voltage at an external connection; and
a hysteretic comparator configured to measure the scaled voltage and output a power valid signal based on the measurement of the scaled voltage.

11. The circuit of claim 10, wherein the power valid signal indicates to a power island that a power voltage is within a valid range and where circuits within a power island perform operations based on the power valid signal.

12. The circuit of claim 10, wherein a dual-voltage power island is an external interface control which is configured to be connected to more than one electrical interface.

13. An integrated circuit comprising:
power control circuitry, which is connected to independently allow or disallow power to a plurality of power islands;
wherein at least two power islands of the plurality of islands each comprise a power-valid measurement circuit and a core circuit, wherein a power-value measurement circuit of a power island is configured to conditionally disable a core circuit of the same power island;
wherein at least one of the at least two power islands comprising a power-valid measurement circuit and a core circuit is a duel-voltage power island that is configured to receive different supply voltages in different modes of operation; and
wherein each of the dual-voltage power island comprises:
selection circuitry configured to produce a scaled voltage by automatically scaling a supply voltage input based on a voltage at an external connection; and
a hysteretic comparator configured to measure the scaled voltage and to output, a power valid signal based on the measurement of the scaled voltage, and configured to enable or disable core circuitry within that respective power island.

14. The integrated circuit of claim 13, wherein each said dual-voltage power island is an external interface control which is configured to be connected to more than one electrical interface.

15. The integrated circuit of claim 13, wherein the power control circuit can select supply voltage of no more than 3.3 volts of power.

16. An integrated circuit comprising:
a comparator configured to test an input voltage against a reference voltage;
a first external supply voltage connection and a second external supply voltage connection; and
a detection circuit configured to detect power on the first external supply voltage connection and to provide a logic output based on the detection of power on the first external supply voltage connection; and
a multiplexer that is configured to, based on the logic output, either connect the input voltage to a first fraction of the voltage on the first external supply voltage connection, or connect the input voltage else to a second fraction of the voltage on the second external supply voltage connection;
wherein the comparator is configured to be operatively connected to provide a power-valid signal.

17. The integrated circuit of claim 16, wherein the comparator is hysteretic.

18. The integrated circuit of claim 16, wherein the input voltage is no more than 3.3 volts of power.

19. A method for operating an integrated circuit comprising the actions of:
independently controlling power to power islands of a plurality of power islands with on-chip power control circuitry;
performing a power-valid measurement at least two power islands of the plurality of power islands, and conditionally disabling respective core circuits of the at least two power islands based on a power-valid measurement of the power island; and
detecting which of at least two valid supply voltage ranges is present in at least one dual voltage power island, and performing the power-valid measurement based on the detection.

20. The method of claim 19, wherein each dual-voltage power island is an external interface control that is configured to be connected to more than one standard electrical interface.

21. A portable data module, comprising:
a memory chip; and
a memory controller chip which is connected to external interface terminals and is configured to control the memory chip, the memory controller chip comprising:
power control circuitry configured to independently allow or disallow power to a plurality of power islands on the controller chip;
wherein at least two power islands of the plurality of power islands each comprise a power-valid measurement circuit and a core circuit, wherein a power-valid measurement circuit of a power island is configured to conditionally disable a core circuit of the same power island;
wherein at least one power island of the plurality of power islands is a dual-voltage power island configured to receive multiple supply voltages from at least one of said external terminals; and
wherein each said dual-voltage power island comprises:
selection circuitry configured to produce a scaled voltage by automatically scaling a supply voltage input based on a voltage at an external connection; and
a hysteretic comparator configured to measure the scaled voltage and output a power valid signal based on the measured scaled voltage, and configured to enable or disable core circuitry within that respective power island.

22. The module of claim 21, wherein the memory chip is a nonvolatile memory chip.

23. The module of claim 21, wherein the power valid signal indicates to a first power island that power voltage is within a valid range and wherein a second power island is configured to operate logic operations based on the power valid signal.

24. The module of claim 21, wherein the power valid signal indicates to a power island that an input power voltage is within a valid range.

25. The module of claim 21, wherein the power-valid signal is a power-on-reset signal.

26. The module of claim 21, wherein at least one power island of the plurality of power islands comprises an overlay random access memory power island.

27. The module of claim 21, wherein the selection circuitry comprises two different voltage dividers.

28. A power on reset circuit, comprising:
- a voltage detection circuit coupled to at least two external power inputs, the voltage detection circuit configured to detect voltage at a first one of said external power inputs receiving power from an external source;
- a multiplexing circuit that operatively couples a selected one of said external power inputs to a test node; and
- a comparator with a first input coupled to a reference voltage, a second input linked to said test node, and an output which provides a power valid signal accordingly;
- whereby said power-valid signal can enable core circuit operation when the voltage from either external source reaches a respective valid level.

29. The circuit of claim 28, wherein said comparator is hysteretic.

30. The circuit of claim 29, wherein said reference voltage is connected from a bandgap-voltage-reference circuit.

31. A method for operating an integrated circuit comprising:
- comparing an input voltage against a reference voltage;
- detecting whether or not power is present on a first external connection of two external connections on a voltage detection circuit, and providing a logic output based on the detection, wherein the input voltage is compared against the reference voltage while the input voltage is connected to either a first fraction of the voltage on the first external connection or to a second fraction of the voltage on a second external connection of the two external connections based on the logic output; and
- providing a power-valid output based on the comparison of the input voltage against the reference voltage.

32. The method of claim 31, wherein a hysteretic comparator compares the input voltage against the reference voltage.

33. The method of claim 31, further comprising:
- generating a power-valid output based on the comparison of the input voltage against the reference voltage, the power-valid output indicating to a first portion of a power island that the connected external connection is providing power voltage within a valid range.

34. The method of claim 31, wherein the input voltage is received through an analog multiplexer.

35. A method for validating power to an integrated circuit having a plurality of power islands, the method comprising:
- selecting one or more power islands to power on using one or more logic controlled switches; and
- within a power island,
  - validating an input voltage with a power-validation circuit, the validation circuit using a comparator to compare a fraction of the input voltage against a reference voltage,
  - detecting power on a first external connection, and
  - switching an input to the comparator to change the fraction of the input voltage based on the detection of power on the first external connection;
- wherein at least one power island of the integrated circuit is multi-supply-voltage compatible.

36. The method of claim 35, wherein switching the input to the comparator to change the fraction of the input voltage comprises selecting one of multiple voltage dividers.

37. The method of claim 35, wherein the comparator is hysteretic.

38. A method for validating voltage on a power island, the method comprising:
- selecting power islands to power on using one or more logic controlled switches;
- controlling logic operation of at least a power island using a power on reset circuit of the power island to validate a supply voltage received thereat, wherein the power on reset circuit tests a fraction of an input voltage against a derived reference voltage;
- detecting the presence or absence of voltage on a first external power input connection of at least two external power input connections to the power island; and
- reconfiguring the power on reset circuit to change the fraction of the input voltage and to connect to a selected one of the at least two external power input connections.

* * * * *

UNITED STATES PATENT AND TRADEMARK OFFICE
CERTIFICATE OF CORRECTION

PATENT NO. : 7,830,039 B2  
APPLICATION NO. : 11/965943  
DATED : November 9, 2010  
INVENTOR(S) : Daniel P. Nguyen et al.

It is certified that error appears in the above-identified patent and that said Letters Patent is hereby corrected as shown below:

In the Claims

In column 15, claim 13, line 26, after "two power islands of the plurality of" insert --power--.

In column 15, claim 13, line 33, after "circuit is a" replace "duel-voltage" with --dual-voltage--.

In column 15, claim 13, line 36, after "wherein each" delete "of the".

In column 15, claim 14, line 45, after "claim 13, wherein each" delete "said".

In column 15, claim 16, line 64, after "connect the input voltage" delete "else".

Signed and Sealed this  
Eighth Day of February, 2011

David J. Kappos  
*Director of the United States Patent and Trademark Office*